(12) United States Patent
Haden et al.

(10) Patent No.: US 6,596,948 B1
(45) Date of Patent: Jul. 22, 2003

(54) PROCESSOR AND POWER SUPPLY CIRCUIT

(75) Inventors: Stuart C. Haden, Lucas, TX (US);
Shaun L. Harris, McKinney, TX (US);
Michael C. Day, Allen, TX (US); Lisa Heid Pallotti, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/560,794

(22) Filed: Apr. 28, 2000

(51) Int. Cl.[7] .......................... H01R 12/04; H05K 1/11
(52) U.S. Cl. .................. 174/262; 174/260; 174/255
(58) Field of Search .......................... 174/255, 254, 174/257, 200, 262–266; 361/792

(56) References Cited

U.S. PATENT DOCUMENTS

| | | | |
|---|---|---|---|
| 5,527,998 A | * 6/1996 | Anderson et al. | 174/255 |
| 5,912,809 A | * 6/1999 | Steigerwald et al. | 174/255 |
| 5,926,377 A | * 7/1999 | Nakao et al. | 174/255 |
| 6,201,194 B1 | * 3/2001 | Lauffer et al. | 174/264 |
| 6,208,501 B1 | * 3/2001 | Ingalls et al. | 361/303 |
| 6,252,177 B1 | * 6/2001 | Stoddard | 174/260 |
| 6,329,610 B1 | * 12/2001 | Takubo et al. | 174/255 |
| 6,337,798 B1 | * 1/2002 | Hailey et al. | 174/250 |

OTHER PUBLICATIONS

U.S. patent application Ser. No. 09/548,464 filed Apr. 13, 2000 for Power Management System for Device With Hot–Swapable Components of Koerber et al.

* cited by examiner

*Primary Examiner*—David L. Talbott
*Assistant Examiner*—Jeremy Norris

(57) ABSTRACT

A high performance processor assembly is electrically connected to a power supply so as to minimize voltage variations associated with the supply of power to the processor assembly. The processor assembly is fabricated on a multi-layered printed circuit board. Power is supplied to components on the printed circuit board by way of parallel and split power planes. The parallel and split power planes reduce inductance and increase capacitance associated therewith. The reduced inductance reduces voltage variations caused by load transient currents. Capacitors are electrically connected to the power planes by way of multiple vias to further reduce inductance.

13 Claims, 9 Drawing Sheets

PROCESSOR AND POWER SUPPLY CIRCUIT

TECHNICAL FIELD OF THE INVENTION

The present invention relates to a processor assembly and, more particularly, to an integral processor and power supply assembly.

BACKGROUND OF THE INVENTION

Processing circuits and other electronic circuits generally require direct current (DC) voltages that are stable and free of transients. Accordingly, the processing circuits and other electronic circuits need to be electrically connected to power supplies that are stable and free of transients. Transients and other variations in the DC power supplies can cause the processing and other electronic circuits to experience anomalies or failures.

High speed and large scale processing circuits are very susceptible to problems caused by voltage variations. Some of these voltage variations are caused by load transient currents and other variations in the DC power supplies. Transient currents react with inherent inductance to create voltage variations, wherein the voltage variations are proportional to the inductance and the derivative of the current over time.

Processing circuits rely on very precise, high speed clock signals to control data signals that pass throughout the processing circuit. The clock and data signals are voltages that are in either a logical "high" state, a "low" state. Transient currents (sometimes referred to herein simply as "transients") on the DC power supplies can cause the clock and data voltages to be falsely interpreted by the receiving circuits as high or low. An erroneously or falsely interpreted clock signal results in the improper flow of data throughout the processing circuit, which may cause the data signals to be improperly processed. An erroneously or falsely interpreted data signal results in an improper data value being processed.

As processing circuits become faster, their clock signal frequencies and the load transient currents increase. In addition, the magnitude of the clock operating voltages decreases. For example, a high frequency clock may use a voltage of 1.3 volts. The increased frequencies of the clock signals result in a decrease in the periods that the clock and data signals are in either the high states or the low states. This limited period at a given state, coupled with a lower operating voltage, increases the criticality of voltage variations on the clock operating voltage. Thus, a very small voltage variation is able to force a clock or data signal into the wrong state. Accordingly, a processing circuit using a high frequency clock is very susceptible to errors caused by relatively small transients and other voltage variations in the DC power supplies. Without very well regulated and stable DC power supplies, the clock speeds and, thus, the processing capabilities of processing circuits are limited.

One method of reducing transients on the power supplied to a processing circuit is by physically locating the power supply close to the processing component, or components, of the processing circuit. This close proximity reduces the distance of the conductors between the power supply and the processing component, which in turn reduces the inductance of the conductors. The length of a conductor is often referred to as the net length. The reduced net lengths reduce inductance and, thus, voltage variations are reduced.

Locating the power supply physically close to the processing component, however, creates additional problems that degrade the performance of the processing circuit. For example, the close proximity of the power supplies to the processors forces other components, such as memory interface circuitry, remote input/output interface circuitry, crossbar communication circuitry, and clock distribution circuitry, to be placed farther away from the processors and, thus, creates performance bottlenecks in each of these varied, yet important computer subsystems. For example, memory components may have to be located a greater distance from the processing component. Accordingly, the net lengths associated with these components increase. The increased net lengths increases the latency between the processing component and its associated components, which slows the processing circuit. For example, a component may require several cycles of the clock in order to respond to a signal received from the processing component.

Other problems occur when the power supply and the processors are located in close proximity to each other. For example, both the power supply and the processing component generate relatively large quantities of heat. When the power supply is physically located near the processing component, a high density of heat is created in the vicinity of the processing component. This heat adversely affects the processing component, i.e., high-temperatures negatively affect silicon transistor switching times and severely degrade the operational frequency of the processor. Adequately removing the heat requires the use of relatively sophisticated and expensive cooling systems, such as refrigerated or cryogenically cooled systems. These cooling systems increase the cost and complexity of the processing circuit as well as decreasing the reliability of the processing circuit.

One method of overcoming the problems of component density and routing resources in processing circuits is to have separate printed circuit board assemblies for the processing and memory subsystems. The separate subsystems, however, compromise the performance of the processing to memory interface. Latency across multiple connectors and multiple boards is high, and bandwidth is reduced. Accordingly, the highest attainable performance is not able to be achieved.

The above-described problems have limited the capabilities of processing and other electronic circuits. Therefore, a need exists for a processing circuit that has a reduced susceptibility to voltage variations and that has processing components located within close proximity to each other.

SUMMARY OF THE INVENTION

The invention is directed toward a processing circuit having minimal susceptibility to voltage variations caused by load transient currents and other sources. The processing circuit may, as an example, comprise a multilayered printed circuit board having processors, memory devices, and other associated electronic components electrically connected thereto. A power supply circuit may be located on a separate printed circuit board that may be electrically connected to the processing circuit.

The multilayered printed circuit board may be formed from a plurality of alternating conductive and insulating layers. Electric power is supplied to components one the printed circuit board by way of a plurality of conductive layers (sometimes referred to as power planes). The processing circuit may have identical power planes located on adjacent conductive layers. The multiple power planes increase the capacitance and decrease the inductance between the power supply and the components, which reduces transients on the power planes. The power planes may also be split so that each layer has power planes associated with different power sources. The split power planes increase the inductance associated with the power supplies because the effective widths of planes are reduced and, thus, voltage variations increase as transients increase on the power planes. This inductance may be offset, however, by the increased capacitance.

Capacitors may be located on the printed circuit board in the vicinity of processing components and may "ring" or encircle the processors and other electronic components. The capacitors may be electrically connected between the power planes and their respective grounds. The capacitors serve to reduce the voltage variations on the power planes caused by the transients from the processing components. Inductance exists between each capacitive element and the power plane, which is determined by the number of connecting vias and their respective geometries. Several vias may pass between each capacitor and the conductive planes, which further reduces the inductance associated with the power supplies. The multiple vias serve to reduce the effective series inductance and effective series resistance by adding vias in parallel.

The processing circuit may have a region for processing that contains processing components and a memory region that contains memory components. The memory region may have a plurality of sockets that allow conventional dual inline memory modules (DIMMs) to be plugged into the sockets. The DIMMs may be arranged so that they are parallel to each other, thus, creating airflow paths between the DIMMs. Airflow within the paths remains substantially constant regardless of the number of DIMMs that are located in the memory region.

The processing circuit may be electrically connected to the power supply circuit and both may be physically attached to a chassis. The chassis may have a plurality of ventilation holes formed therein that regulate airflow over different regions of the processing circuit and the power supply circuit. By varying the size of the ventilation holes, the volume of air passing over different regions of the circuits may be regulated. Accordingly, components that generate the most heat or that are the most susceptible to heat related problems can receive the greatest volume of air.

DETAILED DESCRIPTION OF THE INVENTION

Figure 1:
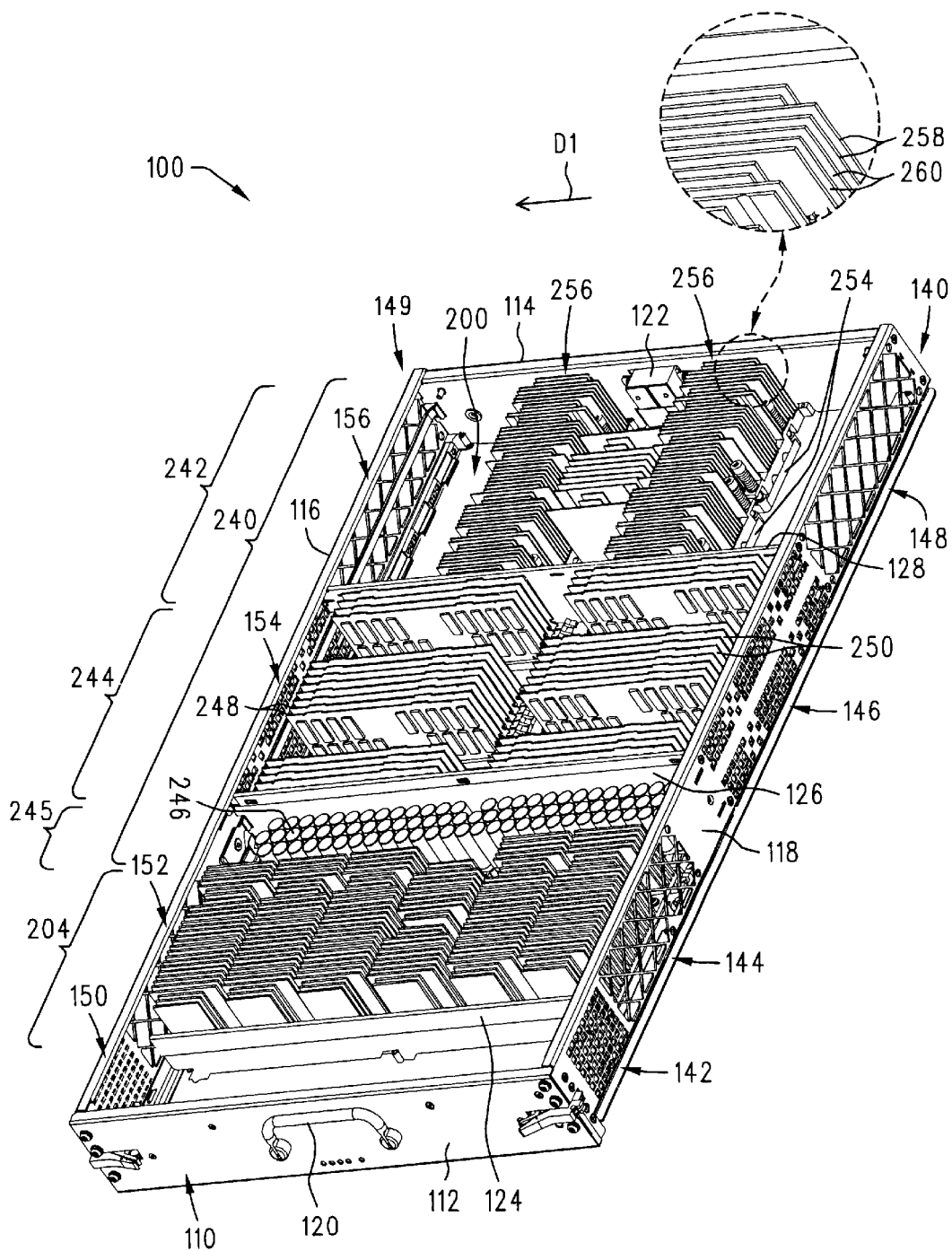
FIG. 1 is a top perspective view of a cell board assembly having a processor board and a power supply board.

FIGS. 1 through 9, in general, illustrate a multilayered printed circuit board 270 that may comprise: a first conductive plane 294 having a first shape; a second conductive plane 296 having a second shape, the first shape being substantially similar to the second shape; and the first conductive plane 294 being located adjacent the second conductive plane 296, wherein the first conductive plane 294 is parallel to and aligned with the second conductive plane 296.

FIGS. 1 through 9 also, in general, illustrate a multilayered printed circuit board 270 comprising: a surface 284; a first conductive plane 294 substantially parallel to the surface 284; at least one electronic component 400 located adjacent the surface 284, the at least one electronic component 400 having a first conductor 408 associated therewith; and a first plurality of vias 412, 414 extending between the first conductive plane 294 and the first conductor 408.

Having generally described the printed circuit board 270, it will now be described in greater detail.

The printed circuit board 270 is, for illustration purposes, described herein with reference to a non-limiting cell assembly 100, FIG. 1. The cell assembly 100 may have a chassis 110 with circuit boards 200 attached thereto. The cell assembly 100 illustrated herein has two circuit boards 200, a power supply board 204 and a processor board 240. The processor board 240 may be divided into a processing section 242, a memory section 244, and a capacitive bulk energy storage section 245 (sometimes referred to herein simply as a "capacitive section") as will be described in greater detail below.

The chassis 110 may serve to support the circuit boards 200 and to assure that the circuit boards 200 do not flex beyond their mechanical limitations. The chassis 110 may have a front portion 112, a rear portion 114, a left portion 116, and a right portion 118. The front portion 112 may have a conventional handle 120 attached thereto. The handle 120 may provide for insertion and extraction of the cell assembly 100 into a larger assembly, e.g., a computer server. The rear portion 114 may have a connector 122 attached thereto. The connector 122 may be electrically and mechanically connected to the circuit boards 200. It should be noted that the 204 may, in a non-limiting embodiment, extend to and abut the front portion 112.

The chassis 110 may have a first divider 124, a second divider 126, and a third divider 128 attached thereto. The first divider 124 in conjunction with the second divider 126 may serve to isolate the power supply board 204 and the capacitive section 245 of the processor board 240 from the remainder of the processor board 240. The second divider 126 in conjunction with the third divider 128 may serve to isolate the memory section 244 of the processor board 240 from both the power supply board 204 and the processing section 242 of the processor board 240. The dividers 124, 126, 128 may also serve to facilitate airflow within the chassis 110. The dividers 124, 126, 128 may also serve to stiffen the circuit boards 200 to prevent them from flexing beyond their mechanical limitations.

Figure 2:
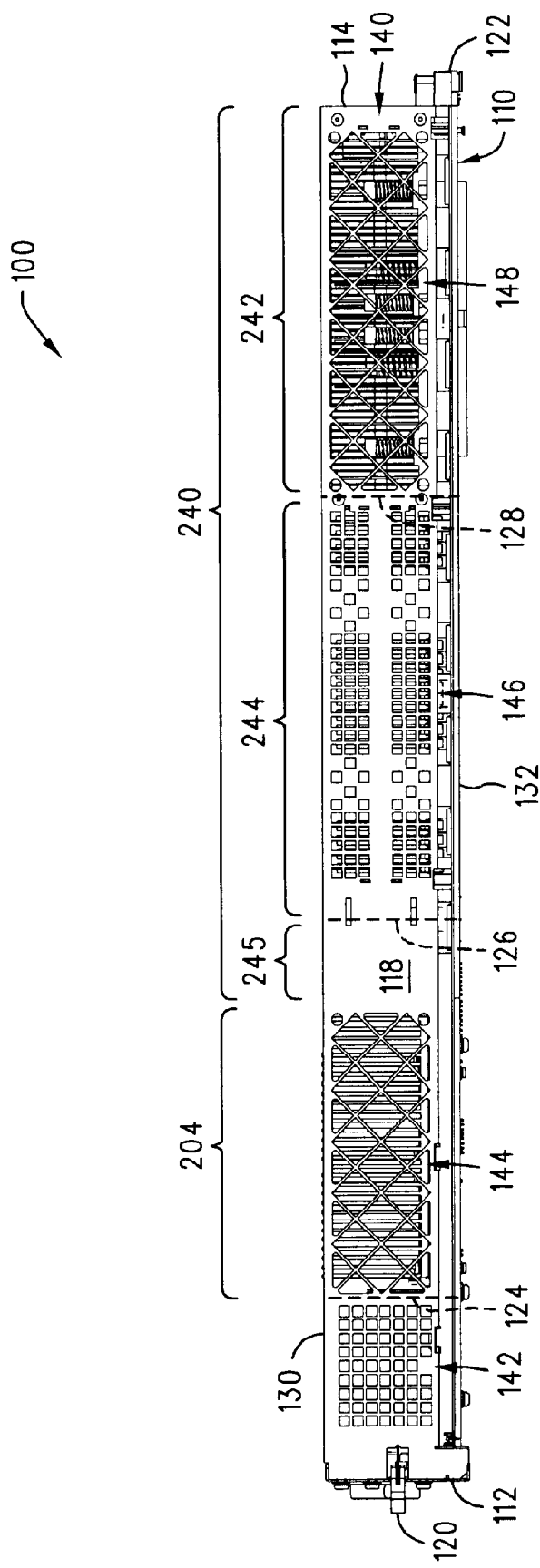
FIG. 2 is a side view of the cell board of FIG. 1.

Referring to FIG. 2, which is a side view of the right portion 118 of the cell assembly 100 of FIG. 1, the chassis 110 may also have an upper portion 130 and a lower portion 132. It should be noted that the upper portion 130 may have a rigid plate, not shown, attached thereto that covers the chassis 110. Alternatively, the rigid plate may have an opening associated with the memory section 244 to allow easy access to electronic components located therein. Likewise, the lower portion 132 may have a rigid plate, not shown attached thereto.

The right portion 118 may have a plurality of grills 140 formed therein. The grills 140 are referenced as the first grill 142, the second grill 144, the third grill 146, and the fourth grill 148. The first grill 142 is located between the front portion 112 and the first divider 124. The second grill 144 is located between the first divider 124 and the second divider 126 and corresponds to the location of the power supply board 204. The third grill 146 is located between the second divider 126 and the third divider 128 and corresponds to the location of the memory section 244 of the processor board 240. The fourth grill 148 is located between the third divider 128 and the rear portion 114 and corresponds to the location of the processing section 242 of the processor board 240.

Referring again to FIG. 1, the left portion 116 may have a plurality of grills 149 formed therein that are substantially similar to the grills 140 formed in the right portion 118. More specifically, the left portion 116 may have a first grill 150, a second grill 152, a third grill 154, and a fourth grill 156. As will be described in greater detail below, the grills 140 and 149 may serve to provide regulated airflow to the various sections of the cell assembly 100.

Having described the chassis 110, the circuit boards 200 will now be described.

Figure 3:
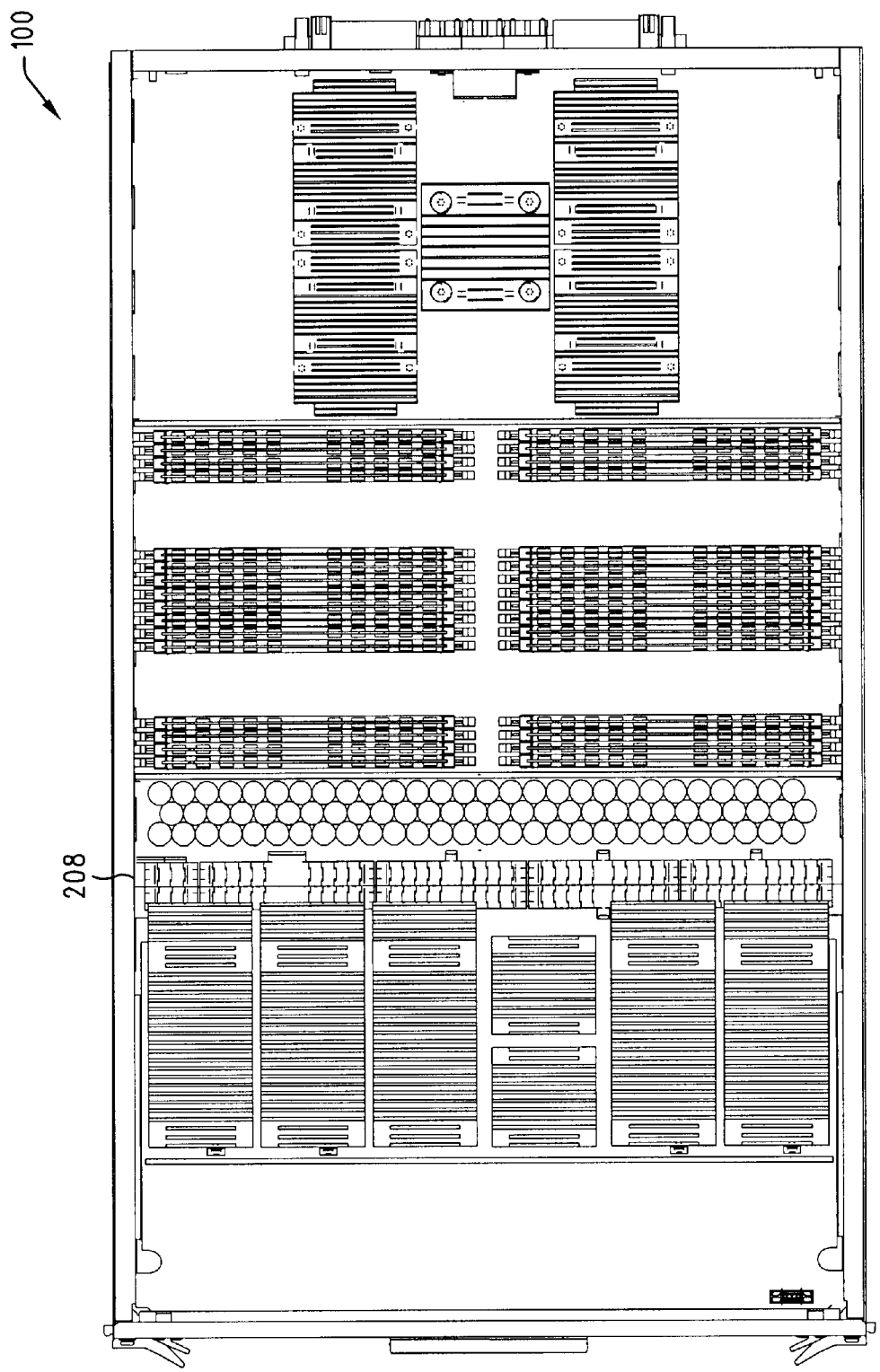
FIG. 3 is a top view of the cell board of FIG. 1.

The power supply board 204 may have several components that supply regulated voltages to the processor board 240. The power supply board 204 may receive a direct current voltage that is converted and regulated into precise DC voltages for use by the processor board 240. In the cell assembly 100 described herein, the power supply board 204 supplies DC voltages of 2.0, 1.8, 2.5, and 3.3 volts. Referring briefly to FIG. 3, which is a top view of the cell assembly 100, the DC voltages are supplied to the processor board 240 via a multiple connector 208. It should be noted that with regard to the non-limiting examples described herein, the power supply board 204 supplies four sources of 2.0 volts and two sources of 3.3 volts.

Referring again to FIG. 1, the memory section 244 of the processor board 240 may have a plurality of dual inline memory modules (DIMMs) 248 electrically and mechanically connected thereto. The DIMMs 248 may be removably connected to the processor board 240 by way of conventional connectors. The DIMMs 248 may be a plurality of printed circuit boards that are substantially perpendicular to the processor board 240. The DIMMs 248 may be oriented in a direction that is substantially perpendicular to the left portion 116 and the right portion 118 of the chassis 110. Thus, the arrangement of the DIMMs 248 may form air paths 250 between the DIMMs 248. The processor board 240 of FIG. 1 has thirty-two DIMMs 248 connected thereto. It should be noted, however, that the number of DIMMs 248 may vary depending on the processing application of the cell assembly 100.

The processing section 242 of the processor board 240 may have a plurality of processors 254 electrically and mechanically connected thereto. The processors 254 are described in greater detail below with reference to FIG. 5. The processors 254 may, as examples, be of the type commercially available from the Hewlett-Packard Company as models PA8500, PA8600, or PA8700. The architecture of the processor board 240 may allow for different processors 254 attached thereto. For example, the processors 254 may all be of the PA8500 type or the PA8600 type.

The processors 254 may have a plurality of heat sinks 256 associated therewith. Each heat sink 256 may have a plurality of fins 258 attached thereto. As shown in FIG. 1, the fins 258 may be substantially planar and may be oriented in a direction that is substantially perpendicular to the left portion 116 and the right portion 118 of the chassis 110. The arrangement of the fins 258 forms a plurality of air paths 260 located therebetween. During operation of the cell assembly 100, the processors 254 may generate excessive heat. The heat sinks 256 draw heat from the processors 254 to the fins 258. Air passes between the fourth grill 148 on the right portion 118 of the chassis 110 and the fourth grill 156 on the left portion 116. In doing so, the air passes in the air paths 260 between the fins 258 to convect the heat out of the cell assembly 100.

The capacitive section 245 of the processor board 240 may have a plurality of electrolytic capacitors 246 electrically and mechanically connected thereto. The capacitive section 245 may, as a non-limiting example, have approximately eighty-one electrolytic capacitors 246 located therein. Each of the electrolytic capacitors 246 may, as an example, have a value of approximately 3,900 $\mu f$. The electrolytic capacitors 246 may serve to dampen any voltage irregularities on voltage lines between the power supply board 204 and the components on the processor board 240. The electrolytic capacitors 246 also serve to remove low frequency AC components present on the DC voltages.

Having described the physical layout of the cell assembly 100, the circuit boards 200 will now be described.

Figure 4:
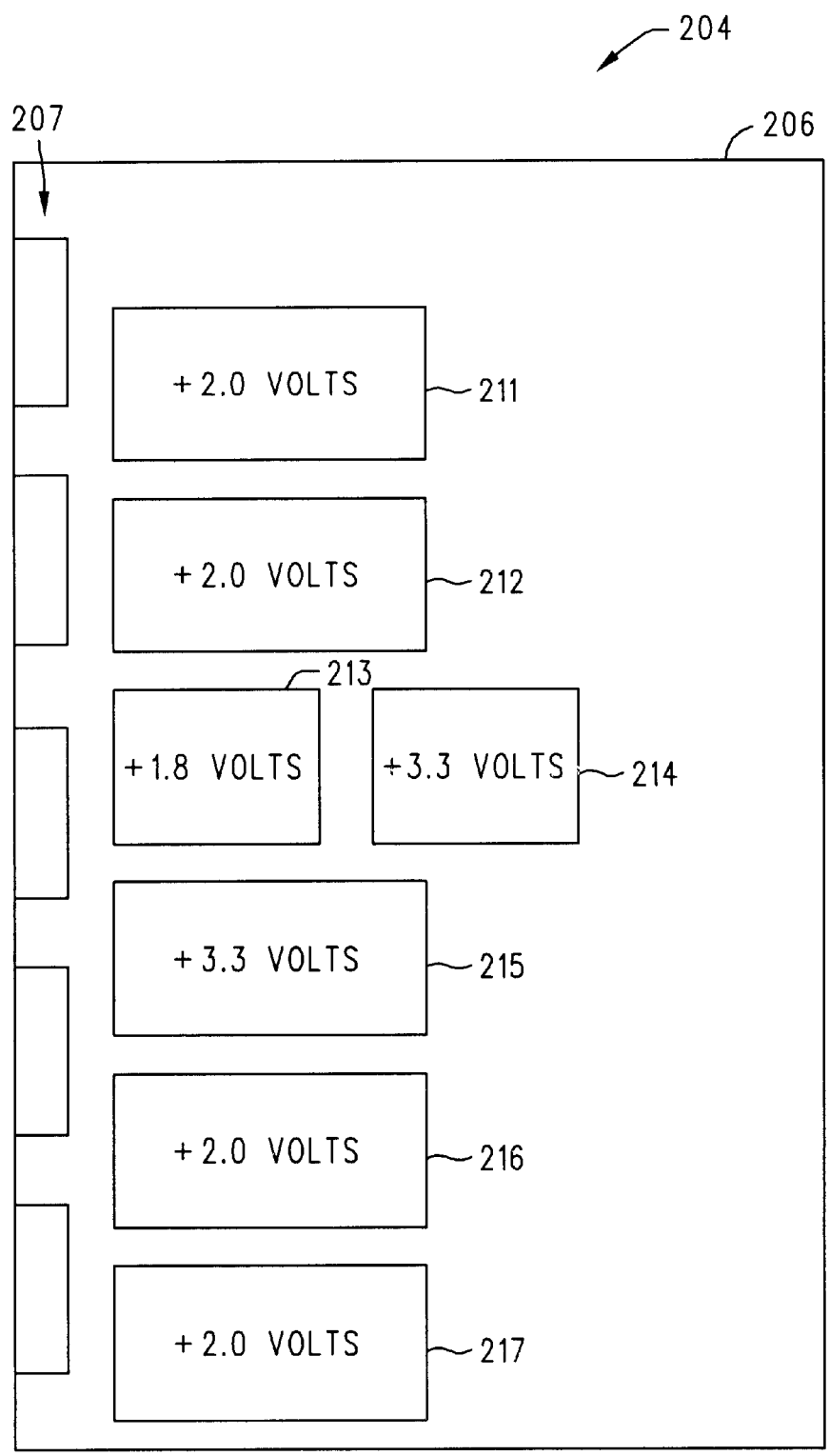
FIG. 4 is a schematic illustration showing the locations of primary components on the power supply board of FIG. 1.

Referring to FIG. 4, the power supply board 204 may comprise a multilayered printed circuit board 206 having a plurality of electronic components electrically and mechanically connected thereto. FIG. 4 shows a schematic illustration of a non-limiting embodiment of the power supply board 204 as illustrated herein. Connections to peripheral devices, such as the processor board 240, may be accomplished by way of a plurality of connectors 207. The connectors 207 are part of the connector 208, FIG. 3.

The power supply board 204 illustrated herein has seven voltage regulators mechanically and electrically connected thereto. A first voltage regulator 211 and a second voltage regulator 212 may each output approximately 2.0 volts. A third voltage regulator 213 may output approximately 1.8 volts. A fourth voltage regulator 214 and a fifth voltage regulator 215 may each output approximately 3.3 volts. A sixth voltage regulator 216 and a seventh voltage regulator 217 may each output approximately 2.0 volts. The above-described voltages may be output to the processor board 240, FIG. 1, by way of the connectors 207. The connectors 207 may also provide unregulated voltages to the regulators by way of the connector 122, FIG. 1. It should be noted that the power supply board 204 has been described herein with seven separate power supplies located thereon. It is to be understood, however, that the power supply board 204 may have any number of different power supplies located thereon depending on the processing application of the processor board 240.

The printed circuit board 206 may, as a non-limiting example, be formed from a plurality of alternating conductive and nonconductive layers. The above-described regulators may be electrically connected to the connectors 207 by way of the conductive layers.

Figure 5:
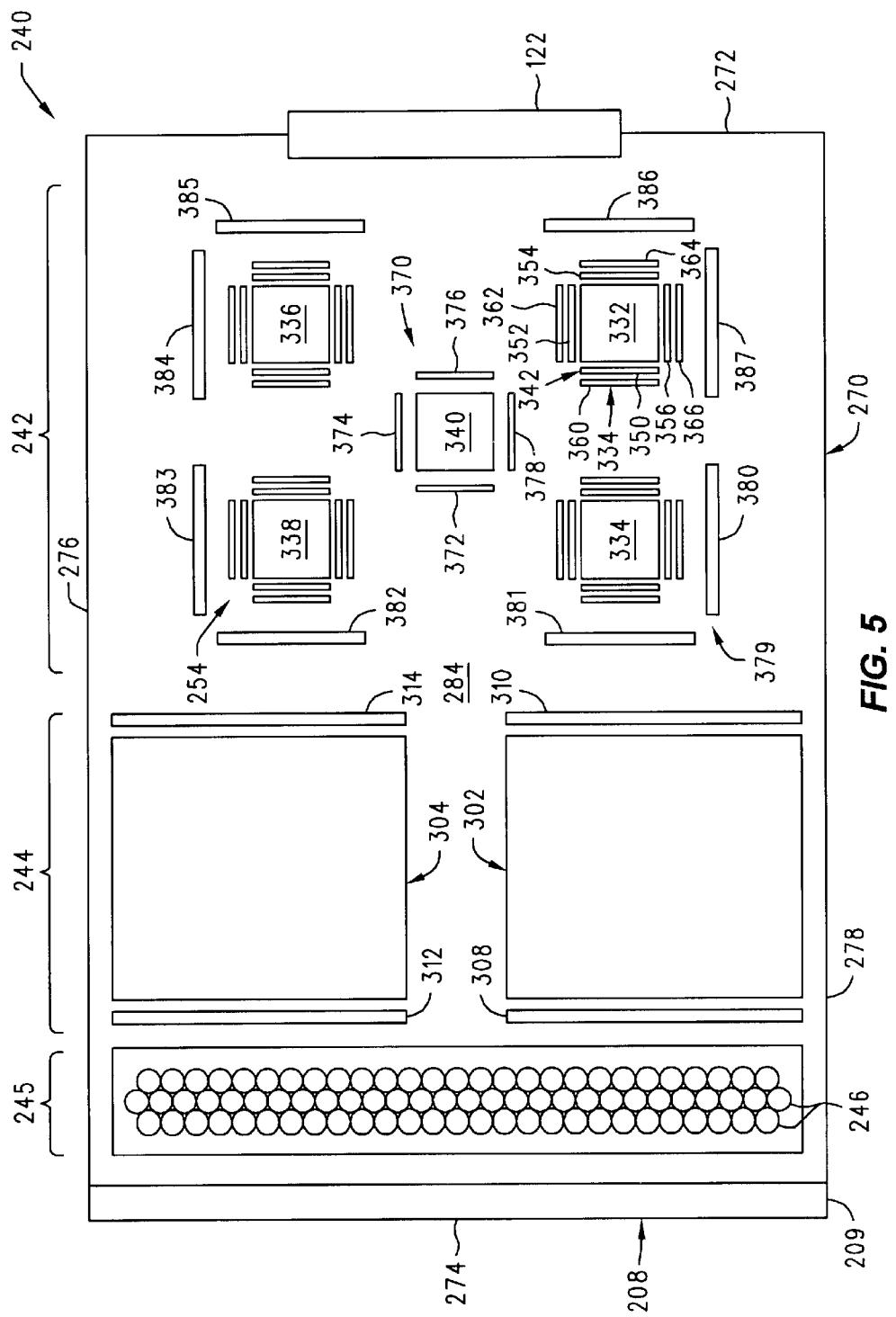
FIG. 5 is a schematic illustration showing the associations between components on the processor board of FIG. 1.

Having described the power supply board 204, the processor board 240 will now be described. A non-limiting, schematic illustration depicting the locations of the components of the processor board 240 is shown in FIG. 5. The processor board 240 may have a printed circuit board 270 with a plurality of electronic components electrically and mechanically connected thereto. The printed circuit board 270 may have a front side 272, a back side 274, a right side 276, and a left side 278. The sides may define the boundaries of a top surface 284 to which the electronic components are connected. It should be noted that electronic components may also be connected to a bottom surface, not shown, that is opposite the top surface 284. The printed circuit board 270 may be relatively small. For example, the distance between the front side 272 and the back side 274 may be less than or equal to 22.5 inches. The distance between the left side 276 and the right side 278 may be less than or equal to 16.5 inches. Accordingly, the size of the chassis 110 of FIG. 1 may be limited. For example, the distance between the left portion 116 and the right portion 118 may be less than or equal to 18.5 inches. The distance between the front portion 112 and the rear portion 114 may be less than or equal to 29.0 inches.

Referring again to FIG. 5, the connector 122, previously described, may be electrically and mechanically connected to the front side 272 of the printed circuit board 270. Another connector 209 may be electrically and mechanically connected to the back side 274 of the printed circuit board 270. The connector 209 may mate with the connectors 207, FIG. 4, on the power supply board 204. Accordingly, DC voltages may be supplied to the electronic components on the printed circuit board 270 by way of the connector 209.

The capacitive section 245 may be located adjacent the back side 274 of the printed circuit board 270. Accordingly, the electrolytic capacitors 246 are the first components on the power lines between the connector 209 and the other components connected to printed circuit board 270. As will be described in greater detail below, the electrolytic capacitors 246 serve to remove any low frequency AC component present on the DC voltages supplied to the printed circuit board 270. The electrolytic capacitors 246 also serve to suppress voltage variations that may occur on the DC voltage lines.

The memory section 244 of the processor board 240 may be located adjacent the capacitive section 245. The memory section 244 is illustrated in the non-limiting embodiment of FIG. 5 as having a first area 302 and a second area 304, which may be substantially similar to each other. Both the first area 302 and the second area 304 may, as a non-limiting example, contain the plurality of DIMMs as were described above with reference to FIG. 1. The DIMMs may be electrically and mechanically connected to the printed circuit board 270 by way of conventional connectors, not shown in FIG. 5. Accordingly, the DIMMs may be readily replaceable.

A first capacitor array 308 and a second capacitor array 310 may be located adjacent the first area 302. The first capacitor array 308 may be located between the capacitive section 245 and the first area 302. The second capacitor array 310 may be located between the first area 302 and the processing section 242. The first capacitor array 308 and the second capacitor array 310 may each, as non-limiting examples, have forty-three surface mount capacitors in the arrays. For illustration purposes, the individual capacitors are not shown in FIG. 5. At least some of the capacitors in the arrays 308, 310 may, as non-limiting examples, be ceramic capacitors having values between 0.1 and 10.0 µf. As a further example, at least some of the capacitors in the arrays 308, 310 may be ceramic capacitors having values of approximately 2.2 µf. Yet as a further example, at least some of the capacitors in the arrays 308, 310 may be tantalum capacitors having values between 75 and 150 µf. Yet as a further example of the tantalum capacitors, at least some of the capacitors in the arrays 308, 310 may have values of approximately 100 µf. It is to be understood that the capacitor values described above may have tolerances of twenty percent. Like the first area 302, a first capacitor array 312 and a second capacitor array 314 may be located adjacent the second area 304. The first capacitor array 312 may be located between the capacitive section 245 and the second area 304. The second capacitor array 314 may be located between the second area 304 and the processing section 242. The capacitors in the first capacitor array 312 and the second capacitor array 314 may, as non-limiting examples, have values equivalent to the capacitor values described above with reference to the arrays 308, 310.

The above-described capacitors may be bypass capacitors electrically connected between DC power lines and planes and their respective grounds. As described below, the capacitors may serve to suppress voltage variations caused by transients at the memory section 244, which prevents corruption of data in the DIMMs.

The processing section 242 may have a plurality of processors 254 located thereon. The printed circuit board 270 illustrated herein has four processors 254 and a control circuit located in the processing section 242. The processors 254 are referenced as the first processor 332, the second processor 334, the third processor 336, and the fourth processor 338. The control circuit is referenced as the control circuit 340. It should be noted that other electronic components may be connected to the processing section 242. As will be described in greater detail below, the processors 254 may be electrically connected to the control circuit 340. In order to improve performance, the processors 254 may be located as close as possible to the control circuit 340. In addition, the processors 254 may be located equal distances from the control circuit 340, which improves timing between the control circuit 340 and the processors 254.

Each of the processors 254 may be substantially surrounded by arrays of capacitors, sometimes referred to as bypass capacitors. The arrangement of the arrays are sometimes referred to as physically "ringing" or encircling the processors. In the non-limiting example described herein, each processor 254 is surrounded by two rings of capacitors. Referring to the first processor 332, which is illustrative of all the processors 254, the first processor 332 may be surrounded by an inner ring 342 and an outer ring 344 of capacitors. The inner ring 342 may be made of four segments, a first segment 350, a second segment 352, a third segment 354, and a fourth segment 356. Each segment may, as an example, have nine surface mount capacitors, and the capacitors may have values of 0.01 to 0.10 µf, within 20%. As a further example, some of the capacitors may have values of approximately 2.2 µf. The outer ring 344 may also be made of four segments, a first segment 360, a second segment 362, a third segment 364, and a fourth segment 366. Each segment may, as an example, have nine surface mount capacitors, the capacitors may have values of 0.01 to 1.0 µf, within 20%. As a further example, some of the capacitors may have values of approximately 2.2 µf. Each of the remaining processors may be surrounded by a similar inner ring and outer ring as the first processor 332. It should be noted that the values and the numbers of capacitors described above may differ depending on their specific application. The capacitors may be electrically connected between power lines and their respective grounds and may serve to suppress voltage variations due to transients. It should be noted that for illustration purposes, the individual capacitors in the segments have not been illustrated.

Like the processors 254, the control circuit 340 may also be surrounded by a ring 370 of capacitors. The ring 370 may have a first segment 372, a second segment 374, a third segment 376, and a fourth segment 378. The first segment 372 and the second segment 374 may each have fourteen surface mount capacitors. The third segment 376 and the fourth segment 378 may each have fifteen surface mount capacitors. Some of the capacitors in the ring 370 may, as a non-limiting example, have values of 0.01 to 10.0 μf, within 20%. As a further example, some of the capacitors may have values of approximately 2.2 μf. The capacitors may be electrically connected between power lines and their respective grounds and may serve to suppress transients and other voltage variations before they reach the control circuit 340. It should be noted that for illustration purposes, the individual capacitors in the segments have not been illustrated.

In addition to the above-described rings, the processing section 242 may be substantially surrounded by a ring 379 of capacitors. The capacitors may be arranged in segments, referred to as the first through the eighth segments and referenced numerically as 380 through 387. Each of the segments may, as an example, have between eighteen and twenty-five surface mount capacitors. Some of the capacitors may, as examples, have values of 1.0 to 10.0 μf, within 20%. As a further example, some of the capacitors may have values of approximately 2.2 μf. The capacitors may be electrically connected between voltage lines and their respective grounds to suppress transients and voltage variations before they reach components located in the processing section 242.

The capacitors in the rings 342, 344, 370, and 379 may serve as bypass capacitors between the power planes and their respective ground planes in order to suppress high frequency transients and other voltage variations. As described above, the capacitors may substantially surround the processors 254 and the control circuit 340. Accordingly, transients and other voltage variations on the power supply lines are less likely to interfere with the processors 254, the control circuit 340 or other electronic components located in the processing section 242. The capacitors may, as an example, be spaced 0.015 inches from each other, within 20%. The vias separation between adjacent capacitors may, as an example, be between 0.05 and 0.8 inches.

It should be noted that the printed circuit board 270 has been described herein with the capacitors mounted to the top surface 284. It should be noted that additional capacitors may be mounted to a bottom surface that is opposite the top surface 284. The additional capacitors serve to double the capacitance between the power planes and the ground planes. As described herein, the power planes and their associated ground planes may be located near the top surface 284. Accordingly, the additional capacitors on the bottom surface will have slightly higher inductances associated with them due to longer vias required to reach the power plane. More precisely, the higher inductance may be due to the longer distances between the conductive layers 282 and the power consuming devices on the top surface 284 of the printed circuit board 270.

Having described the components connected to the printed circuit board 270, the printed circuit board 270 itself will now be described. A description of the operation of the printed circuit board 270 follows this description.

Figure 6:
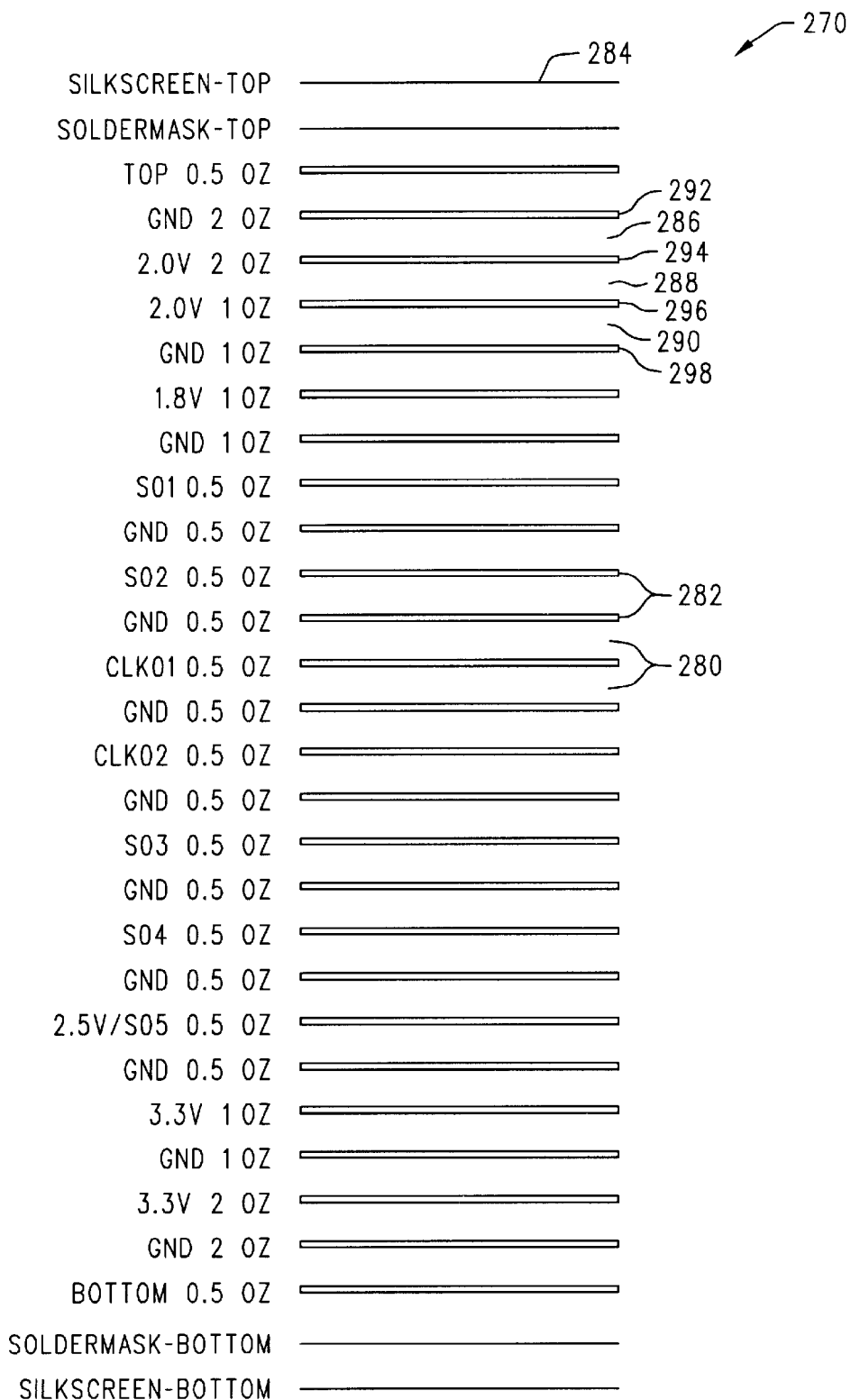
FIG. 6 is a schematic illustration depicting the layers of the processor board of FIG. 5.

The printed circuit board 270 may be a multilayered printed circuit board. FIG. 6 illustrates a non-limiting example of the layers that may form the printed circuit board 270. The printed circuit board 270 may be fabricated from a plurality of alternating dielectric layers 280 and conductive layers 282. The dielectric layers 280 may, as an example, be made of conventional FR4 material. The dielectric layers 280 may, as an example, have thicknesses of between 0.0025 and 0.004 inches. The overall thickness of the 270 may, as an example, be approximately 0.13 inches. The conductive layers 282 may be made of copper or other conventional conductive materials. FIG. 6 shows a non-limiting example of the weight of copper that may be used in the fabrication of each of the conductive layers 282. In addition to the layers, the printed circuit board 270 has a top surface 284 to which electronic components may be mounted. It should be noted that electronic components may also be electrically and mechanically connected to a bottom surface of the printed circuit board 270.

In order to further describe a non-limiting embodiment of the printed circuit board 270, reference is made to a first dielectric layer 286, a second dielectric layer 288, and a third dielectric layer 290. A first conductive layer 292 is located above and adjacent the first dielectric layer 286. A second conductive layer 294 is located between the first dielectric layer 286 and the second dielectric layer 288. A third conductive layer 296 is located between the second dielectric layer 288 and the third dielectric layer 290. A fourth conductive layer 298 is located below and adjacent the third dielectric layer 290. In the non-limiting embodiment described herein, the first conductive layer 292 and the fourth conductive layer 298 are ground planes. The second conductive layer 294 and the third conductive layer 296 supply DC voltages to the components mounted to the printed circuit board 270. In the non-limiting embodiment illustrated herein, the second conductive layer 294 and the third conductive layer 296 are substantially similar conductive planes that supply two volts to electronic components mounted to the printed circuit board 270. Their thicknesses may, as an example, be based on one or two ounce conventional copper for printed circuit board fabrication.

Figure 7:
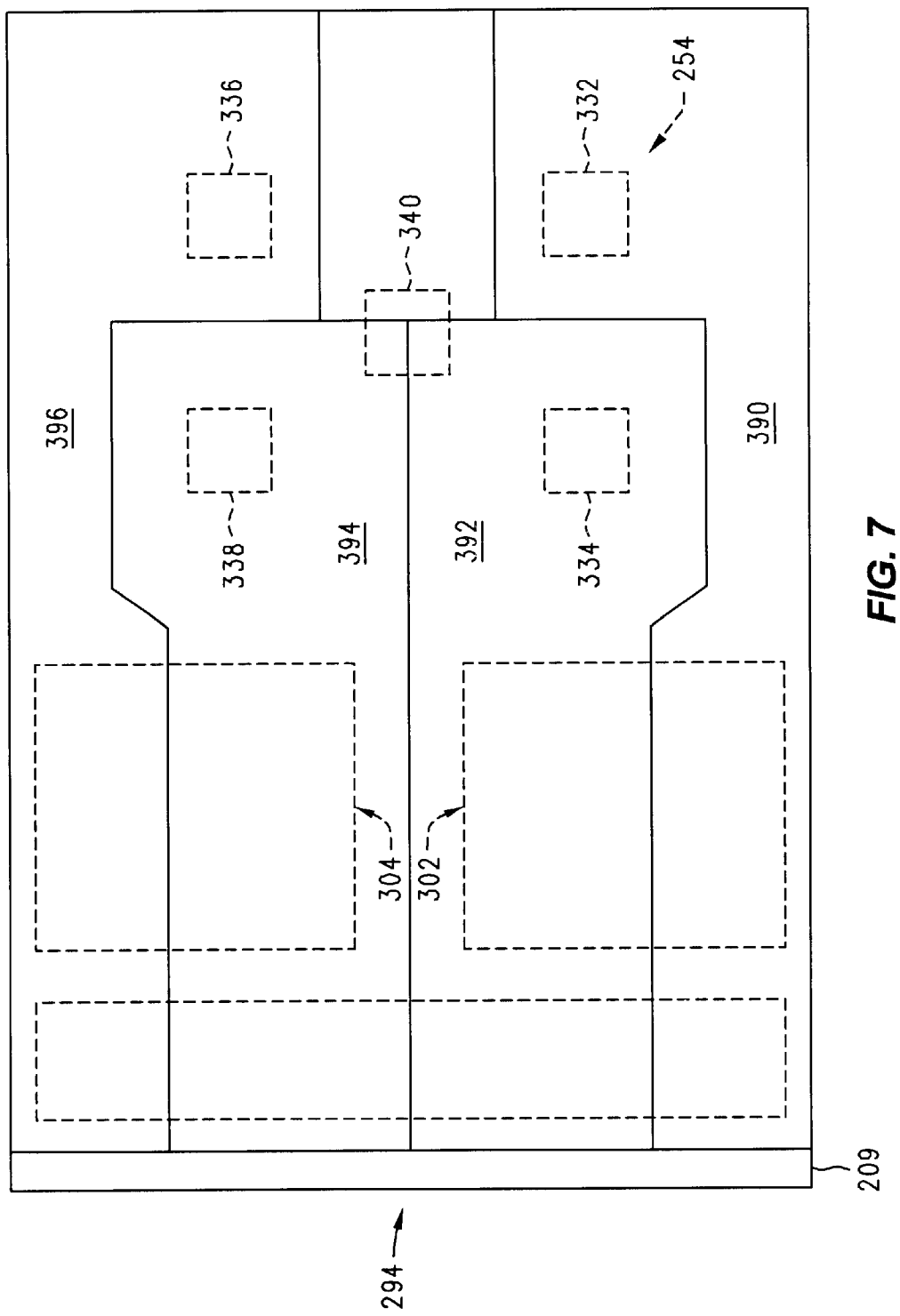
FIG. 7 is a schematic illustration showing the power planes within the processor board of FIG. 5.

The physical layouts of the second conductive layer 294 and the third conductive layer 296 are illustrated in FIG. 7. As described above, the second conductive layer 294 is substantially similar to the third conductive layer 296. Accordingly, for illustration purposes, only the second conductive layer 294 is illustrated in FIG. 7. The second conductive layer 294 may be divided into four separate sections, a first plane section 390, a second plane section 392, a third plane section 394, and a fourth plane section 396. The four sections do not electrically contact one another. The second conductive layer 294 is sometimes referred to herein as being a "split power plane" because the conductive planes 282 are split into different sections. During operation, each section of the second conductive layer 294 is biased at approximately the same voltage, e.g., two volts, with reference to a ground plane.

With additional reference to FIG. 4, the first plane section 390 may be electrically connected to the first voltage regulator 211. The second plane section 392 may be electrically connected to the second voltage regulator 212. The third plane section 394 may be electrically connected to the sixth voltage regulator 216. The fourth plane section 396 may be electrically connected to the seventh voltage regulator 217. Accordingly, the first processor 332 may be supplied voltage from the first voltage regulator 211. The second processor 334 may be supplied voltage from the second voltage regulator 212. The fourth processor 338 may be supplied voltage from the sixth voltage regulator 216. The third processor 336 may be supplied voltage from the seventh voltage regulator 217.

By splitting the second conductive layer 294 into the separate sections, inductance between the second conductive layer 294 and its respective ground plane, the first conductive layer 292 is increased. However, the addition of the third conductive layer 296 and its respective ground plane, the fourth conductive layer 298, reduces the total net inductance. Voltage variations are proportional to the inductance multiplied by the derivative of current over time. Thus, the reduced inductance serves to limit the voltage variation. Accordingly, when a transient occurs on the second conductive layer 294 having a reduced inductance, the magnitude of the voltage variation is reduced. In addition, the current flow in the second conductive layer 294 is regulated by distributing devices that draw large amounts of current among the different sections.

Referring again to FIG. 6, the second conductive layer 294 is separated from the third conductive layer 296 by the second dielectric layer 288. Accordingly, capacitance exists between the second conductive layer 294 and the third conductive layer 296. This capacitance reduces leading edge voltage variations that may occur as a result of transients. The capacitance is increased by reducing the thickness of the second dielectric layer 288 (capacitance is proportional to the inverse of the thickness). For example, the second dielectric layer 288 may have a thickness of approximately 0.0016 inches and a dielectric constant of approximately 4.2. The conductive layers may have an area of approximately sixteen square inches. Accordingly, the capacitance between the conductive layers is approximately 0.06 $\mu f$ with very small effective series resistance or inductance. This capacitance has characteristically extremely low effective series resistance and inductance, and consequently, very high frequency response.

Figure 8A:
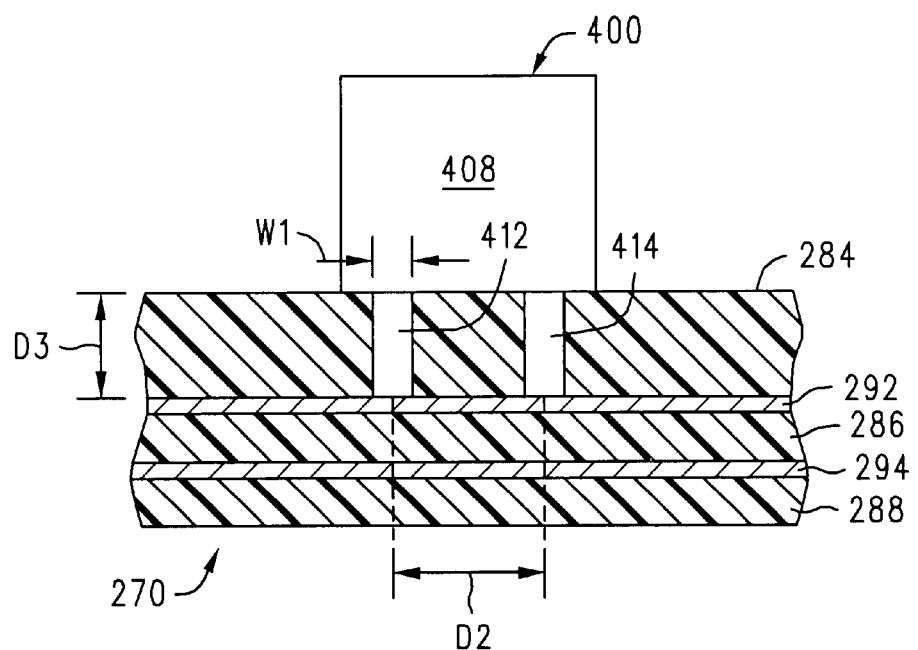
FIG. 8A is a front view of the electrical connections between a capacitor and conductive planes in the processor board of FIG. 5.
Figure 8B:
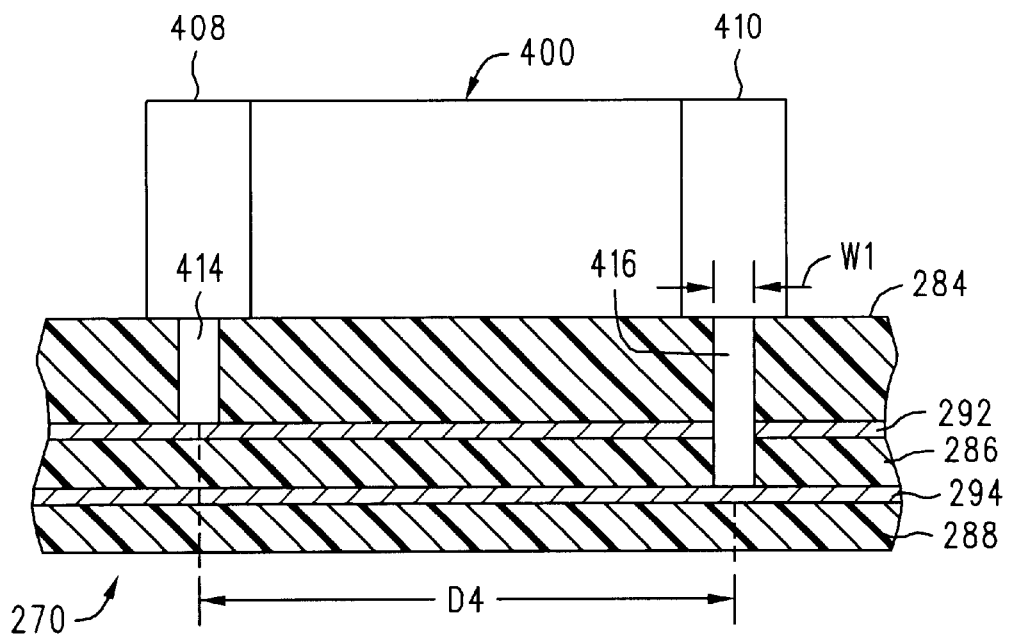
FIG. 8B is a side view of the capacitor of FIG. 8A.

Referring again to FIG. 5, as described above, a plurality of capacitors may ring the processors 254, the processing section 242, and the memory section 244. FIGS. 8A and 8B show an embodiment of the connection between a capacitor 400 and the first and second conductive layer 294, 296. The connection described herein reduces the inductance associated with the capacitor 400 and, thus, serves to suppress voltage variations due to transients.

Referring to FIG. 8A, the capacitor 400 may be a surface mount ceramic device that is mounted to the top surface 284 of the printed circuit board 270. The capacitor 400 has a first side 408 that is a conductor. The first side 408 is located adjacent a first via 412 and a second via 414. The first and second vias 412, 414 are conductive tracks that extend between the top surface 284 and the first conductive layer 292. The first via 412 and the second via 414 may be separated by a distance D2 and each may have a length D3. Both the first via 412 and the second via 414 may have widths W1.

Referring to FIG. 8B, which is a side view of the capacitor 400 of FIG. 8A, the capacitor 400 may have a second side 410. Like the first side 408, the second side 410 may be a conductor or lead associated with the capacitor 400. A third via 416 extends between the second side 410 of the capacitor 400 and the second conductive layer 294. It should be noted that several vias may extend between the second side 410 and the second conductive layer 294. It should be noted that several vias may extend between the second side 410 and the third conductive layer 296. The second via 414 and the third via 416 may be separated by a distance D4. By reducing the distance D4, the inductance associated with the capacitor 400 is further reduced. The distance D4 may as an example be between approximately 0.1 and 0.2 inches and more preferably, approximately 0.1 inches.

The use of multiple vias with minimal widths W1 along with a minimal distance D4 and length D3 significantly reduces the inductance associated with the capacitor 400.

For example, the width W1 may be equal to approximately 0.012 inches, the distance D4 may be equal to approximately 0.14 inches, and the length D3 may be approximately equal to 0.13 inches. Inductance between the vias 414, 416 is proportional to the inverse hyperbolic cosine of the distance D4 divided by the width W1. Using the parameters described above, the resulting inductance is 1259 nH/m or 31.98 nh/in. As described in FIG. 8A for a length of D3, the effective series inductance is 41.6 nH per via pair.

The first conductive layer 292 may be a ground plane and the second conductive layer 294 may provide a potential, e.g., 2.0 volts, relative to the first conductive layer 292. Accordingly, the capacitor 400 serves to couple the second conductive layer 294 to ground. By locating both the first conductive layer 292 and the second conductive layer 294 close to the top surface 284, the lengths of the vias are minimized, which minimizes the effective series inductance associated with the vias.

It should be noted that the conductors 408 and 410 may each be electrically connected to their respective conductive planes by more than two vias. This further reduces the inductance and resistance associated with the capacitor 400.

Having described the electronic components located on the printed circuit board 270, their function and relation to each other will now be described.

Referring again to FIG. 5, with reference to supplying the electronic components with power, direct current voltages are suppled to the printed circuit board 270 by way of the connector 209. The conductive layers 282 within the printed circuit board 270 electrically connect the connector 209 to the various electronic components. Accordingly, the conductive layers 282, FIG. 6, serve to supply DC power to the electronic components on the printed circuit board 270. The electrolytic capacitors 246 in the capacitive section 245 serve to remove low frequency AC components of the DC voltages.

Power is supplied to the processing section 242 and the memory section 244 by way of the conductive layers 282, FIG. 6. The first capacitor array 308 and the second capacitor array 310 substantially encompass the first area 302 and serve to suppress voltage variations due to transients at the DIMMs or other components in the first area 302. Likewise, the first capacitor array 312 and the second capacitor array 314 serve to suppress voltage variations at the DIMMs or other components in the second area 304. If a voltage variation occurs at a DIMM or other component in the memory section 244, it may cause data associated with the memory section 244 to become corrupt. Accordingly, by using a large number of closely spaced capacitors in the arrays 308, 310, 312, 314, a transient on the conductive layers 282 has a reduced probability causing a voltage variation of substantial magnitude at a DIMM or other component. This probability is further reduced by using capacitors having multiple vias. In one embodiment of the printed circuit board 270, the capacitors in the arrays 308, 310, 312, 314 may be spaced a distance of approximately 0.015 inches from each other, with a tolerance of approximately twenty percent.

The processing section 242 is surrounded by the ring 379 of capacitors. The ring 279 reduces the probability that a transient will cause a voltage variation of substantial magnitude in the processing section 242. As with the memory section 244, the capacitors in the ring 379 may be closely spaced. In addition, the ring 379 also serves to suppress high frequency voltage deviations on the DC voltages caused by transients.

The individual processors 254 and the control circuit 340 are also surrounded by rings of capacitors to reduce the possibility that a voltage variation may reach them. Each of the processors 254 are surrounded by the inner ring 342 and the outer ring 344 of capacitors. The capacitors in the inner ring 342 and the outer ring 344 may be closely spaced to further reduce the probability of transients reaching the processors 254. As described above, the capacitors in the outer ring 344 may have higher capacitive values and different effective series inductance and resistance than the capacitors in the inner ring 342. This differing capacitive, effective series inductance, and resistance values suppress transients comprising different spectral components. More specifically, the higher value effective series resistance and inductance suppress transients having lower spectral components and the lower value effective series resistance and inductance suppress transients having higher spectral components.

Referring again to FIG. 1, heat generated by the electronic components degrades the performance of the processor board 240. The most significant heat-generating components are the processors 254, the control circuit 340, FIG. 5, and the DIMMs 248. In addition, the regulators on the power supply board 204 generate heat. The cell assembly 100 may use forced air to convect the heat from these devices to the surrounding atmosphere. Air from a single source, e.g., a fan or blower, not shown, may be forced through the grills 140 in the direction D1, past the heat generating components, and out through the grills 149. As described above, the grills 140 and the grills 149 have different grill portions that have different aperture sizes. The aperture sizes establish the airflow rate through the grills and, thus, the airflow rate past selected electronic components. It should be noted that the air may flow in a direction opposite the direction D1.

The electronic components are oriented so that convection is maximized. For example, the heat sinks 256 have fins 258 formed therein. The fins 258 are substantially perpendicular to the grills 140, 149. Accordingly, the air paths 260 are also perpendicular to the grills 140, 149. This arrangement of the air paths 260 permits the free flow of air through the air paths 260, which improves the convection of heat. In a similar manner the DIMMs 248 are arranged so that they are perpendicular to the grills 140, 149. Accordingly air is able to flow freely in the air paths 250 between the DIMMs 248, which improves convection.

The airflow past the DIMMs 248 is regulated by the size of the apertures in the third grill 146 of the right portion 118 and the third grill 154 of the left portion 116. The airflow is substantially independent of the number of DIMMs 248 in the memory section 244. Accordingly, convection cooling continues to be efficient regardless of the number of DIMMs 248 present.

Having described the power and cooling components of the processor board 240, the function of the processor board 240 will now be described.

It should be noted that the cell assembly 100 may be one of a plurality of cell assemblies or processing assemblies that are located within a larger module. For example, the cell assembly 100 may be one of a plurality of cell assemblies located within a computer server.

Figure 9:
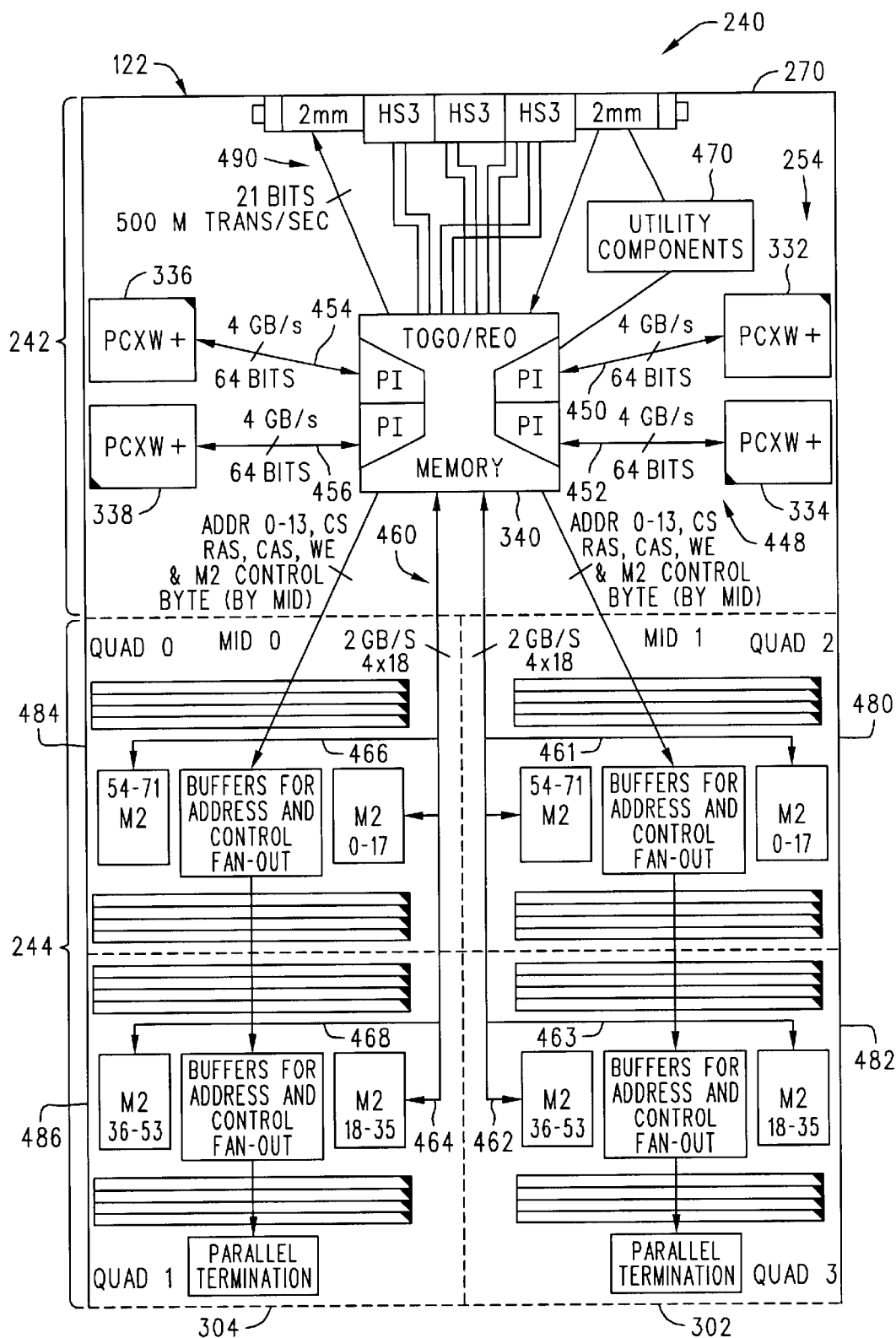
FIG. 9 is a block diagram illustrating the data flow associated with the processor board of FIG. 5.

Reference is made to FIG. 9, which is a block diagram illustrating the data flow associated with the processor board 270. The control circuit 340 serves as an interface and control circuit between the processors 254 and components electrically connected to the printed circuit board 270, including components to which the cell assembly 100 is connected. The control circuit 340 may be electrically connected to the processors 254 by way of a plurality of data busses 448. More specifically, the first processor 332 may be electrically connected to the control circuit 340 by a first data bus 450. The second processor 334 may be electrically connected to the control circuit 340 by a second data bus 452. The third processor 336 may be electrically connected to the control circuit 340 by a third data bus 454. The fourth processor 338 may be electrically connected to the control circuit 340 by way of a fourth data bus 456. It should be noted that the components and the data busses 448 shown in FIG. 9 are not necessarily drawn to scale nor are the components necessarily properly positioned.

Unlike conventional processors, each of the data busses 448 may be a separate bus interfaces between the control circuit 340 and a processor 254. Accordingly, the capabilities of the processor board 240 are not constrained by bus sharing requirements. Each of the data busses 448 may, as an example, have 64 conductors and may be able to transfer two hundred fifty megabits per second. Accordingly each of the data buses 448 may be capable of transferring approximately four gigabits per second.

Each of the data busses 448 may comprise a plurality of conductors. For example each of the data busses 448 may have sixty-four conductors. The conductors may be grouped according to their functions. For example, conductors carrying similar data signals may be grouped together.

As described above, each of the processors 254 may be located as close as possible to the control circuit 340. In addition, each of the processors 254 may be located at substantially equal distances from the control circuit 340. Accordingly, the data busses 448 are substantially the same length and are as short as possible. More specifically, the conductors in each group may be substantially the same length. For example, the groups of conductors in the data busses 448 may have lengths of between 1.8 and 4.2 inches. The equal lengths of the conductor groups improve timing between the control circuit 340 and the processors 254. More specifically, data signals and other signals present on the data busses 448 take the same time to interact with the processors 254 and the control circuit 340. The short lengths improve the processing speed of the processor board 240 by reducing the time taken for signals to propagate on the data busses 448 between the control circuit 340 and the processors 254. The data busses 448 may be electric conductors located within the printed circuit board 270 as illustrated in FIG. 4.

It should be noted that the pinouts of the components mounted to the top surface 284 have been selected to reduce routing congestion between the components, which minimizes the layer counts. For example, the pinouts of the control circuit 340 and the processors 254 may be selected to minimize routing congestion and, thus, layer counts. It should also be noted that the lengths of conductors used for data transfer may be minimized and tightly controlled for timing purposes. For example, this tends to result in low-latency and high-bandwidth angle within the processing portions of the cell assembly 100.

In addition to the data busses 448, the processor board 240 may have a plurality of memory data busses 460 electrically connecting memory devices to the control circuit 340. More specifically, the memory data busses 460 may have a first memory data bus 462 and a second memory data bus 464. The memory data busses 460 may be electric conductors located within the printed circuit board 270 as illustrated in FIG. 5. The first memory data bus 462 may serve to electrically connect memory devices, such as DIMMs, in the first area 302 to the control circuit 340. Likewise, the second memory data bus 464 may serve to electrically connect memory devices in the second area 304 to the control circuit 340.

In order to better describe the memory data busses 460, the memory section 244 has been divided into a first quadrant 480, a second quadrant 482, a third quadrant 484, and a fourth quadrant 486. A first portion 461 of the first memory data bus 462 may electrically connect the control circuit 340 to memory devices located in the first quadrant 480. A second portion 463 of the first memory data bus 462 may electrically connect the control circuit 340 to memory devices located in the second quadrant 482. A first portion 466 of the second memory data bus 464 may electrically connect the control circuit 340 to memory devices located in the third quadrant 484. A second portion 468 of the second memory data bus 464 may electrically connect the control circuit 340 to memory devices located in the fourth quadrant 486.

Like the processors 254, the memory devices are physically located in close proximity to the control circuit 340. Accordingly, the lengths of the memory data busses 460 may be minimized. For example, the memory data busses 460 may have lengths of between 7.0 and 15.7 inches. In addition, the lengths of the individual conductors in the different portions of the memory data busses 460 may be substantially equivalent. For example, the lengths of the conductors in the first portion 461 of the first memory data bus 462 may have lengths that are within 0.05 inches of each other. It should be noted that the memory data busses 460 may electrically connect the control circuit 340 to memory management devices noted as M2s in FIG. 9. Additional data busses may electrically connect the memory management devices to DIMMs or other memory devices. These additional data busses have minimal lengths, e.g., 1.25 to 2.3 inches.

As illustrated in FIG. 9, a plurality of data busses 490 may extend between the connector 122 and the control circuit 340. The data busses 490 may serve to electrically connect the control circuit 340 to a remote input/output device (not shown) and a cross bar (not shown) by way of the connector 122. The data busses associated with the remote input/output device may have relatively short lengths, e.g., five to seven inches. The lengths of the individual conductors that are associated with each other may, however, have lengths that are within 0.05 inches of each other. In addition, the lengths of the conductors may be compensated to account for delays incurred by the connector 122. Likewise, the data busses associated with the crossbar may have minimal lengths, e.g., three to seven inches. Associated groups of conductors may have lengths that are within, as an example, 0.03 inches of each other. The lengths of the conductors may be compensated to account for delays incurred by the connector 122.

The processor board 240 may also have a circuit referred to as utility components 470. The utility components 470 may monitor hardware present on the processor board 240 and transmit the hardware information to external processors or the like. For example, the utility components 470 may monitor the number of memory components and processor types connected to the processor board 240. This information may be used to determine the electric power requirements of the processor board 240. Accordingly, appropriate power may be supplied to the power supply board 204, FIG. 1, which in turn supplies power to the processor board 240. An embodiment of the utility components 470 and its operation is described in the U.S. patent application, Ser. No. 09/548,464 of Koerber et al., filed on Apr. 13, 2000 for POWER MANAGEMENT SYSTEM FOR DEVICE WITH HOT-SWAPABLE COMPONENTS, which is hereby incorporated by reference for all that is disclosed therein.

The ability to physically locate processing components and memory components close to each other was achieved by locating the power supply components away from the processing components. Conventional processing circuits are not able to locate the power supply components away from the processing components and maintain the processing capabilities of the processing components. This is due to load transient currents that occur on the power lines and cause voltage fluctuations or variations. Voltage fluctuations, in turn, cause processing errors and the like.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A multilayered printed circuit board comprising:
a circuit board surface;
a first plane comprising a first surface, said first surface comprising a plurality of first conductive plane portions that do not electrically contact one another, said plurality of first conductive plane portions forming first shapes; and
a second plane comprising a second surface, said second surface comprising a plurality of second conductive plane portions that do not electrically contact one another, said plurality of second conductive plane portions forming second shapes; said first shapes being substantially similar to said second shapes; said first surface facing said second surface; and said first shapes being aligned with said second shapes;
at least one electronic component located adjacent said circuit board surface, said at least one electronic component having a first conductor associated therewith; and
a plurality of first adjacent vias extending between at least one of said first conductive plane portions and said circuit board surface;
said plurality of first vias electrically connecting said at least one of said first conductive plane portions and said first conductor.

2. The multilayered printed circuit board of claim 1, wherein said at least one electronic component is a capacitor.

3. The multilayered printed circuit board of claim 1, wherein said at least one electronic component is at least one ceramic capacitor.

4. The multilayered printed circuit board of claim 3, wherein said at least one ceramic capacitor has a capacitance value of between about 0.01 microfarads and about 10.0 microfarads.

5. The multilayered printed circuit board of claim 3, wherein said at least one ceramic capacitor has a capacitance value of about 2.2 microfarads.

6. The multilayered printed circuit board of claim 3 wherein said at least one ceramic capacitor has a capacitance value of about 10.0 microfarads.

7. The multilayered printed circuit board of claim 1, wherein said plurality of first vias are spaced a distance of about 0.006 to about 0.015 inches from each other.

8. The multilayered printed circuit board of claim 1, wherein said at least one electronic component has a second conductor associated therewith and further comprising a plurality of second vias extending between at least one of said second conductive plane portions and said second conductor.

9. The multilayered printed circuit board of claim 8 wherein said plurality of first vias are spaced from said plurality of second vias by a distance of about 0.1 inches to about 0.2 inches.

10. The multilayered printed circuit board of claim 8 wherein said plurality of first vias are spaced from said plurality of second vias by a distance of about 0.1 inches.

11. A multilayered printed circuit board comprising:

a surface first conductive plane substantially parallel to said surface;

a second conductive plane, said second conductive plane being spaced a distance from said first conductive plane;

at least one electronic component located adjacent said surface, said at least one electronic component having a first conductor and a second conductor associated therewith;

a first plurality of vias extending between said first conductive plane and said first conductor; and a second plurality of vias extending between said second conductive plane and said second conductor;

said first plurality of vias being spaced a distance of about 0.006 inches to about 0.015 inches from each other.

12. The multilayered printed circuit board of claim 11 wherein said first plurality of vias is spaced a distance of about 0.1 inches to about 0.2 inches from said second plurality of vias.

13. The multilayered printed circuit board of claim 11 wherein said first plurality of vias is spaced a distance of about 0.1 inches from said second plurality of vias.

* * * * *